United States Patent
Parkhe et al.

(10) Patent No.: US 6,743,473 B1
(45) Date of Patent: *Jun. 1, 2004

(54) CHEMICAL VAPOR DEPOSITION OF BARRIERS FROM NOVEL PRECURSORS

(75) Inventors: Vijay D. Parkhe, San Jose, CA (US); Gilbert Hausmann, Ben Lomond, CA (US); Jagadish Kalyanam, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/505,638

(22) Filed: Feb. 16, 2000

(51) Int. Cl.$^7$ ............................ C23C 16/06; C23C 16/34
(52) U.S. Cl. ............. 427/252; 427/249.1; 427/255.394; 427/255.7
(58) Field of Search ................ 427/252, 249.1, 427/255.394, 255.7

(56) References Cited

U.S. PATENT DOCUMENTS

| | | | |
|---|---|---|---|
| 4,992,305 A | | 2/1991 | Erbil |
| 5,130,172 A | * | 7/1992 | Hicks et al. ............... 427/252 |
| 5,403,620 A | | 4/1995 | Kaesz et al. |
| 5,856,236 A | | 1/1999 | Lai et al. |
| 5,929,266 A | | 7/1999 | Jones et al. |
| 6,099,903 A | | 8/2000 | Kaloyeros et al. |
| 6,491,978 B1 | * | 12/2002 | Kalyanam ............ 427/255.394 |

| | | | |
|---|---|---|---|
| 2001/0034097 A1 | * | 10/2001 | Lim et al. .................. 438/253 |

FOREIGN PATENT DOCUMENTS

| | | |
|---|---|---|
| EP | 0 106 537 | 1/1989 |
| EP | 1 067 595 | 1/2001 |

OTHER PUBLICATIONS

Australian Patent Office Search Report from SG 200100858–0, Dated Oct. 8, 2001.

* cited by examiner

Primary Examiner—Bret Chen
(74) Attorney, Agent, or Firm—Moser, Patterson & Sheridan LLP

(57) ABSTRACT

The present invention provides a method and precursor for forming a metal and/or metal nitride layer on the substrate by chemical vapor deposition. The organometallic precursor has the formula of $(Cp(R)_n)_x MH_{y-x}$, where Cp is a cyclopentadienyl functional group, R is a substituent on the cyclopentadienyl functional group comprising an organic group having at least one carbon-silicon bond, n is an integer from 0 to 5, x is an integer from 1 to 4, M is a metal, and y is the valence of the metal M. A metal, metal nitride, metal carbon nitride, or metal silicon nitride film is deposited on a heated substrate by thermal or plasma enhanced decomposition of the organometallic precursor in the presence of a processing gas, such as hydrogen, nitrogen, ammonia, silane, and combinations thereof, at a pressure of less than about 20 Torr. By controlling the reactive gas composition either metal or metal nitride films may be deposited. The deposited metal or metal nitride film may then be exposed to a plasma to remove contaminants, densify the film, and reduce film resistivity.

31 Claims, 5 Drawing Sheets

CHEMICAL VAPOR DEPOSITION OF BARRIERS FROM NOVEL PRECURSORS

BACKGROUND OF THE INVENTION

1. Field of the Invention

The present invention relates to a metallization process for manufacturing semiconductor devices. More particularly, the invention relates to a method for depositing metal and metal nitride layers by chemical vapor deposition of a precursor.

2. Background of the Related Art

Reliably producing sub-half micron and smaller features is one of the key technologies for the next generation of very large scale integration (VLSI) and ultra large scale integration (ULSI) integrated circuits. However, as the fringes of circuit technology are pressed, the shrinking dimensions of interconnects in VLSI and ULSI technology has placed additional demands on processing capabilities. The multi-level interconnect features that lie at the heart of this technology require careful processing of high aspect ratio features, such as vias, lines, contacts, and other features. Reliable formation of these features is very important to the VLSI and ULSI success and to the continued effort to increase circuit density and quality of individual substrates and die.

As circuit densities increase, the widths of vias, contacts and other features, as well as the dielectric materials between them, decrease to less than one micron dimensions, i.e., 0.25 $\mu$m or less, whereas the thickness of the dielectric layers remains substantially constant, with the result that the aspect ratios for the features, i.e., their height divided by width, increases. Many traditional deposition processes have difficulty filling sub-micron structures where the aspect ratio exceeds 4:1, and particularly where it exceeds 10:1. Therefore, there is a great amount of ongoing effort being directed at the formation of void-free films for sub-micron features having high aspect ratios.

Conducting metals such as aluminum, copper, and tungsten, are used to fill sub-micron features on substrates during the manufacture of integrated circuits. However, aluminum and copper can diffuse into the structure of adjacent dielectric layers which may form a conductive path and cause device failure. Although, tungsten suffers from less than desirable adhesion to adjacent metal and dielectric layers which may cause the formation of interlayer defects, such as delamination of the tungsten from the patterned substrate, diffusion and less than desirable adhesion may be prevented by depositing a liner layer and/or a barrier layer in a feature before depositing the conducting metal. For conducting metals, the liner layer is preferably composed of a metal that provides good adhesion to the underlying material; and the barrier layer deposited on the liner layer is often a nitride or silicon nitride of that metal which helps protect the underlying material from interlayer diffusion and chemical reactions with subsequently deposited materials.

With the recent progress in sub-quarter-micron copper interconnect technology, tantalum, niobium and the respective nitrides have become popular barrier materials in addition to titanium and titanium nitride. Depending on the application, a diffusion barrier layer may comprise a tantalum or niobium layer, a tantalum nitride or niobium nitride layer, a tantalum/tantalum nitride or niobium/niobium nitride stack or other combinations of diffusion barrier materials. Tantalum, niobium and the respective nitride films have typically been deposited by physical vapor deposition (PVD) and by chemical vapor deposition (CVD) techniques at near atmospheric pressures. However, traditional PVD techniques are not well suited for providing conformal coverage on the wall and bottom surfaces of high aspect ratio vias and other features.

The ability to deposit conformal tantalum and niobium films in high aspect ratio features by the decomposition of organometallic precursors has gained interest in recent years for developing metal organic chemical vapor deposition (MOCVD) techniques. In such techniques, an organometallic precursor gas is introduced into the chamber and caused to decompose, allowing the metal portion thereof to deposit a film layer of the metal on the substrate, and the organic portion of the precursor being exhausted from the chamber. Currently, MOVD techniques deposit films at near atmospheric conditions. However, films deposited at near atmospheric conditions generally have less than desirable coverage of sub-micron features formed on a substrate which can lead to void formation in the substrate features and possible device failure. Further, atmospheric film deposition tends to deposit material on the surfaces of the chamber, which may subsequently flake or delaminate and become a particle problem within the chamber. Particle deposition in the chamber can produce layering defects in the deposited films and provide less than desirable interlayer adhesion.

Additionally, at the present time, there exists only a few commercially available tantalum and niobium precursors, and the precursors that are available produce films that have unacceptable levels of contaminants such as carbon and oxygen, thereby increasing the film's resistivity and producing films having low diffusion resistance, low thermal stability, and other undesirable film characteristics. Additionally, many precursors, such as for tantalum films, produce nitride films of less than desirable quality and a more effective metal nitride precursor is needed.

The available nitride precursors often produce films that are highly resistive and, in some cases, may be insulative, typically as a result of the inability to control crystalline structure or the chemical structure of the film deposited from the precursor. As the nitrogen content increases in metal films, such as tantalum, the film becomes increasingly resistive, and in the case of a tantalum nitride film, a high nitrogen content will eventually transition a good conducting phase with superior barrier properties, such as $Ta_2N$, to a $Ta_3N_5$ insulating phase. In particular, many of the available tantalum nitride precursors readily deposit an insulating $Ta_3N_5$ phase. Furthermore, there are no current satisfactory MOCVD techniques and precursors for depositing materials, such as silicon, which can be added to the liner/barrier materials to improve diffusion resistance, chemical resistance, thermal stability or enhance interlayer adhesion.

One problem with depositing liner/barrier schemes using current CVD liner/barrier deposition techniques is that often during substrate processing, it is required to transfer the substrate between processing chambers and/or systems in order to deposit both the metal and metal nitride films. The transfer of substrates between processing chambers and systems increases processing time and decreasing substrate throughput while exposing the films to contamination.

Therefore, there remains a need for forming liner/barrier layers of materials from organometallic precursors with the liner/barrier layers having good interlayer adhesion, higher resistance to diffusion, and greater thermal stability than those produced with prior processes. It would be desirable for the precursors to be deposited in a process by either thermal decomposition or by plasma enhanced decomposition to selectively produce metal and/or metal nitride films that are substantially free of contaminants and have low film resistivities. It would be further desirable if both metal and metal nitride films could be deposited in situ using the same precursor sequentially in the same processing chamber.

SUMMARY OF THE INVENTION

The invention generally provides for an organometallic precursor and a method of forming a metal and/or metal nitride on a substrate using the chemical vapor deposition of the organometallic precursor at sub-atmospheric pressures below about 20 Torr. One aspect of the invention provides a thermally decomposable organometallic precursor having the formula:

$$(Cp(R)_n)_x MH_{y-x} \quad (I)$$

wherein:
Cp is a cyclopentadienyl functional group,
M is a metal selected from the group consisting of tantalum, vanadium, niobium, and hafnium,
R is an organic group, preferably having at least one carbon-silicon bond,
n is an integer from 0 to 5,
x is a integer from 1 to 4, and
y is the valence of M.

The organic group preferably comprises an alkylsilyl functional group, and most preferably comprises at least three carbon-silicon bonds. The alkyl silyl group may further include at least one silicon-oxygen bond.

In another aspect of the invention, an organometallic precursor of the formula $(Cp(R)_n)_x MH_{y-x}$ is used process a substrate by depositing a metal or metal nitride film at sub-atmospheric pressures. The method comprises introducing the organometallic precursor into a processing chamber maintained at a pressure of less than about 20 Torr, exposing the organometallic precursor to a processing gas, and decomposing the organometallic precursor to deposit a film. The organometallic precursor may be deposited by a thermal or plasma-enhanced process. The method further comprises exposing the film to a plasma to remove contaminants, densify the film, and reduce the film's resistivity. In an preferred embodiment, a metal film comprising tantalum is deposited in a processing gas comprising argon, hydrogen, and combinations thereof, and is treated with a the plasma comprising argon, hydrogen, and combinations thereof.

Another aspect of the invention provides a method of depositing a metal/metal nitride liner/barrier layer. The method comprises depositing a metal layer by either a thermal or plasma-enhanced decomposition of an organometallic precursor of the formula $(Cp(R)_n)_x MH_{y-x}$ in the presence of a processing gas, such as argon or hydrogen, and the metal nitride layer is deposited on the metal layer by the decomposition of an organometallic precursor of the formula $(Cp(R)_n)_x MH_{y-x}$ in a nitrating reactant gas, such as nitrogen or ammonia ($NH_3$). The same organometallic precursors may be used for the deposition of both the metal and metal nitride layers which may further occur sequentially in the same processing chamber. Alternatively, the organometallic precursor may deposit a metal silicide or metal silicon nitride film by the addition of a silicon containing reactant gas, such as silane, to the processing or reactant gases when decomposing the precursor. To remove contaminants, densify the film, and reduce the film's resistivity the metal layer (and metal silicide layer) of the liner/barrier layer scheme is preferably exposed to a non-nitrating plasma and the metal nitride layer (and metal silicon nitride layer) may be exposed to either a nitrating or non-nitrating plasma following deposition. For depositing films containing carbon, metal carbon nitride films, may be deposited by foregoing the post deposition plasma treatment.

In another aspect of the invention, a feature is formed on a substrate by depositing a dielectric layer on the substrate, etching a pattern into the substrate, depositing a metal layer on the substrate by the decomposition of an organometallic precursor of the formula $(Cp(R)_n)_x MH_{y-x}$ in the presence of a processing gas, depositing a metal nitride layer on the substrate by the decomposition of an organometallic precursor of the formula $(Cp(R)_n)_x MH_{y-x}$ in the presence of a nitrating reactant gas, and depositing a conductive metal layer on the metal nitride layer. Once deposited, the metal layer is preferably exposed to a non-nitrating plasma and metal nitride layer may be exposed to either a nitrating or non-nitrating plasma following the formation of the metal nitride layer on the metal layer. The conductive metal is preferably copper and may be deposited by physical vapor deposition, chemical vapor deposition, or electrochemical deposition, preferably electroplating or electroless deposition.

BRIEF DESCRIPTION OF THE DRAWINGS

So that the manner in which the above recited features, advantages and objects of the present invention are attained and can be understood in detail a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention many admit to other equally effective embodiments.

DETAILED DESCRIPTION OF THE PREFERRED EMBODIMENT

Figure 1:
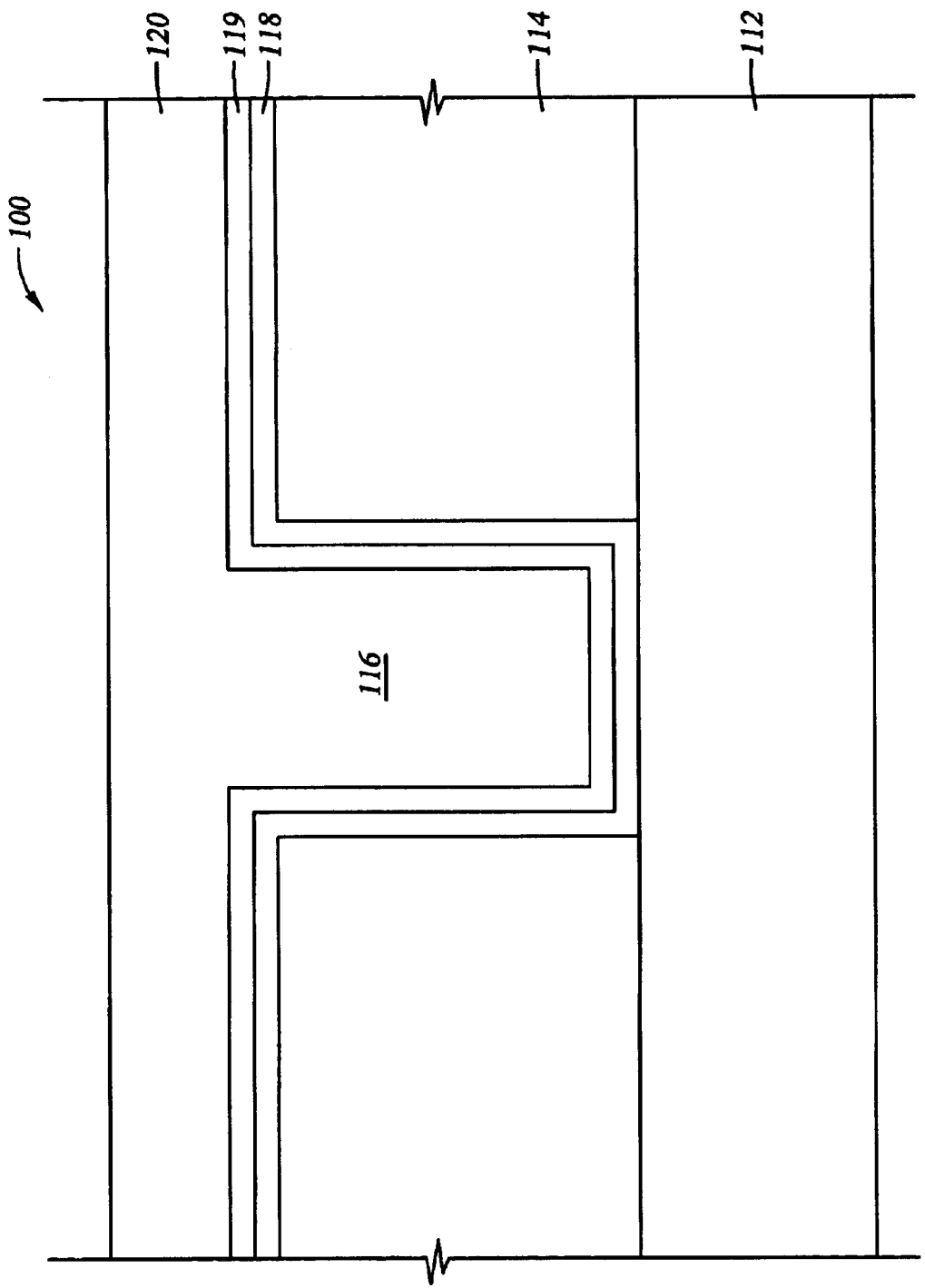
FIG. 1 is a cross sectional view of an interconnect in a dielectric layer illustrating a metallization technique for forming such interconnect by the invention.

The invention generally provides an organometallic precursor and a method of processing a substrate at sub-atmospheric pressures below about 20 Torr by forming a metal or metal nitride liner/barrier layer in a metalation stack on the substrate by chemical vapor deposition (CVD) of the organometallic precursor. The organometallic precursor has the formula $(Cp(R)_n)_x MH_{y-x}$ is provided for the deposition of a metal or metal nitride film. The metal or metal nitride film is deposited on a heated substrate by thermal or plasma enhanced decomposition of the organometallic precursor having the formula $(Cp(R)_n)_x MH_{y-x}$ in the presence of a processing gas. Decomposition is defined herein as the transformation of a compound into one or more substances. The processing gas may be an inert gas, such as helium and argon, and/or a reactant gas selected from the group of hydrogen, nitrogen, ammonia, silane, and combinations thereof, where the composition of the processing gas may deposit metal, metal nitride, metal carbon nitride, and metal silicon nitride films. Preferably, a plasma comprises the processing gases and an inert gas such as argon. The metal and metal nitride films may be deposited from the same precursor sequentially in the same chamber, and may be used as a liner/barrier scheme in a conducting metal, preferably copper, metallization. The organometallic precursor may decompose by heating the substrate to a temperature above the decomposition temperature of the organometallic precursor between about 100° C. and about 450° C., and preferably between about 250° C. and about 450° C. The organometallic precursor may decompose by stirring a plasma at a power between about 200 and about 1000 Watts, more .preferably, about 750 Watts. Once deposited, the metal or metal nitride film may then be exposed to a plasma to remove contaminants and reduce film resistivity.

In the above precursor formula, M represents the metal to be deposited, preferably a metal. Metals which can be deposited according to this invention are hafnium and the Group VB metals of vanadium, tantalum, and niobium. Y is the valence of the metal M of the precursor, with a valence of 4 for hafnium, and a valence of 5 for the Group VB metals According to the invention, Cp is a cyclopentadienyl ring having the general formula $(C_5H_5-)$ and forms a ligand with the metal, M. Preferably between 1 and 4 cyclopentadienyl groups are used to form the precursor, and most preferably, the precursor contains two cyclopentadienyl groups. In the substituted cyclopentadienyl formula, $(Cp(R)_n)_x$, x is the number of cyclopentadienyl groups forming ligands with the metal M. R is a substituent group replacing one or more hydrogens on the cyclopentadienyl ring and n is the number of substituent groups disposed on the ring.

The substituent group R is organic group, preferably having at least one carbon-silicon bond, and which may additionally contain at least one silicon-oxygen bond. The number of substituent groups on the cyclopentadienyl ring, represented by n, can number up to 5 when forming a ligand with the metal of the precursor. Silane and silioxane derived functional groups are exemplary organic compounds having at least one carbon-silicon bond which can be substituted on the cyclopentadienyl rings of the precursor. Preferred hydrocarbon substituents are alkylsilyl groups, preferably having from 1 to 3 hydrocarbyl substituent groups, where hydrocarbyl substituent groups are defined as carbon containing organic functional groups, for example, methyl and ethyl. The most preferred alkylsilyl groups are silyl($SiH_3-$), methylsilyl($CH_3-SiH_2-$), dimethylsilyl($(CH_3)_2-SiH-$), triethylsilyl($(CH_3)_3-Si-$), and combinations thereof. The substituent group may further include alkyl or alkenyl substituents on the same cyclopentadienyl ring with the silicon containing substituents to provide higher volatility. Other suitable substituents of the cyclopentadienyl ring include the fluorinated, derivatives of the alkyl, alkenyl, or silicon containing substituents. With the silicon containing substituent groups, a film can be deposited containing silicon, but preferably, a silicon containing processing gas such as silane is used to ensure sufficient silicon to form metal silicide and metal silicon nitride films.

The presence of the substituent groups on the cyclopentadienyl groups, particularly the silicon containing substituent groups, provide for enhancing preferred physical properties such as increasing the precursor's volatility, decreasing the decomposition temperatures, and lowering the boiling points to the organometallic precursor than unsubstituted cyclopentadienyl functional groups. Preferred precursors have compositions that contain functional groups which allow the formation of heat decomposable organometallic compounds that are thermally stable at temperatures below about 150° C., but thermally decompose with the deposition of metal at a temperature from about 150° C. to about 100° C. Preferred precursors are also liquids at 100° C. or below for efficient handling in current precursor liquid delivery systems for chemical vapor deposition chambers. Relatively low thermal decomposition temperatures of the precursors allow for economical operation of processing chambers at temperatures from about 150° C., to about 1000° C., but preferably between about 100° C. to about 450° C., and most preferably between about 250° C. to about 450° C., with few, if any, requirements for special high temperature resistant equipment.

The presence of substituent groups on the cyclopentadienyl rings also allows a greater temperature difference between the melting point and the decomposition temperature of the precursor in comparison to unsubstituted cyclopentadienyl rings. A large temperature difference between the melting point and decomposition temperature of the precursors allow the vaporization of the liquid precursors into a carrier gas stream at convenient operating temperatures of the liquid delivery system, preferably from about 60° C. to about 100° C., without the risk of premature decomposition. Additionally, the precursors preferably have high vapor. pressures of at least 0.1 Torr at 100° C. so as to ensure sufficient entrainment of the precursor in vaporized fluid flow to the processing chamber. The high volatility of the precursor compounds ensures a sufficiently high concentration of precursor in carrier gas for effective deposition of a metal containing film. Higher volatility will allow the use of vaporization of the precursor by sublimation and delivery to a processing chamber without risk of premature decomposition. Additionally, the presence of substituent cyclopentadienyl groups also provide sufficient solubility of the precursor for use in liquid delivery systems and in direct liquid injection systems.

Once the precursor composition is selected, a metal, metal nitride, metal carbon nitride, and a metal silicon nitride film may be deposited. The film, composition is determined by controlling the process gas composition and the plasma gas composition for the deposition process. A metal film is deposited in the presence of the processing gas, preferably non-nitrating reactant gases including hydrogen, silane, silane derivatives, and combinations thereof. In a preferred embodiment of the invention, the metal film is deposited in the presence of argon, hydrogen, and combinations thereof, but most preferably argon. Metal nitride films are deposited in the presence of a nitrating reactant gas, preferred nitrating gases are selected from nitrogen, ammonia, and nitrogen and hydrogen combination gases. Silane and silane derivatives in combination with nitrating gases may also be used to deposit metal nitride films. Film deposited in the presence of a silane or silane derivative processing gas produce metal silicides and metal silicon nitrides. Metal carbon nitride films may be deposited by incomplete decomposition of the metal precursor, without a post deposition treatment plasma. The preferred metals for deposition are metal including hafnium, and the Group VB metals which include vanadium, tantalum, and niobium. The metal nitrides being nitrides, carbon nitrides, and silicon nitrides of the respective metals.

Preferably, once the precursor has deposited the film, a plasma treatment is used to lower the film's resistivity, remove contaminants, and density the film to enhance barrier and liner properties. The plasma gas composition is preferably the processing gases used to deposit the film. Plasma treatment with nitrating gases may further nitrate a deposited film, which may be undesirable for nitrogen sensitive films, such as tantalum nitride, where non-nitrating plasma treatments are used. Generally, for metal and metal nitride films, a plasma of argon, hydrogen, and combinations thereof, but most preferably argon, is used in the post deposition plasma, process. Preferably, for metal carbon nitride films, plasma treatments are not performed since the plasma treatment may remove the desired carbon content of the film. If a plasma treatment for a carbon nitride film is performed, the plasma gases preferably comprise inert gases, such as argon and helium. The deposition and plasma treatment of the deposited film may be performed in the same or different chambers.

The properties and stoichiometry of the films are also affected by the post-deposition plasma treatment. The plasma composition can also affect the nitrogen content of the deposited film by further adding nitrogen to the film and changing the metal nitride film's phase. By controlling the composition of the plasma gas, the phase of the metal nitrides can also be controlled. Plasmas that do not nitrate the film are preferably used for films that are sensitive to nitrogen content, such as tantalum nitride, to minimize the film's resistivity and prevent formation of high nitrogen content insulative phases such as $Ta_3N_5$. To remove impurities and reduce resistivity by minimizing the nitrogen content in metal nitride films, a plasma composed of hydrogen and an inert gas may be used for tantalum nitride .

Nitrating plasmas are preferably used on films where added nitrogen in the films does not have detrimental consequences to the film's properties, such as in niobium nitride films. Unlike tantalum, niobium nitride films of different stoichiometries are conducting films, so nitrogen content has a less effect on the films properties. Nitrating plasma gases are preferably ammonia and/or nitrogen and may include other gases such as hydrogen. Nitrating plasmas can further nitrate films to provide a preferred metal nitride grain growth that reduces sheet resistivity of the film and increases film densification.

It is believed that depositing the film and post treating the deposited film will produce a film with improved material properties. The use of the metals of the invention, such as tantalum and niobium, which have greater diffusion resistance and higher thermal stability than prior art materials, such as titanium and titanium nitride, will produce improved barrier films. Following deposition, the plasma process will remove resistive constituents, such as contaminants of carbon and oxygen, from the film to lower the films resistivity and improve electrical conductivity. The plasma process will also density the film and remove layering defects, thereby improving the deposited film's diffusion resistance. Additionally, it is further believed that the post deposition plasma will density material disposed at the bottom of substrate features in preference over material disposed on the sidewalls of the feature. This forms a more conductive film at the bottom of the feature, at the contact point between different levels of the device, than on the sidewalls where the feature typically contacts insulator materials.

The Deposition Process

The invention may be used to advantage in an liner/barrier deposition process to form a metal/metal nitride barrier/liner stack for a conductive metal layer. In an integrated liner/barrier metallization scheme of the invention, a metal layer is conformally deposited by a chemical vapor deposition (CVD) technique from the heat degradation of an organometallic precursor having the formula according to the invention in the presence of a processing gas. A metal nitride of the metal may then deposited by CVD technique from the decomposition of an organometallic precursor having the formula according to the invention in the presence of a nitrating reactant gas on the metal layer.

Preferably the metal/metal nitride barrier/liner stack is deposited from the same precursor in the same processing chamber. Further, each deposited layer can be exposed to a post-deposition plasma prior to subsequent material depositions to enhance the effectiveness of the barrier/liner scheme by removing impurities and densifying the film. The plasma, may use nitrating or non-nitrating gases, but preferably non-nitrating gases are used for metal films and nitrogen content sensitive metal nitride films, such as tantalum nitride. The conductive metal deposited is preferably copper and may be deposited by physical vapor deposition, chemical vapor deposition, or electrochemical deposition, preferably by an electroplating or electroless deposition process.

While other metals, preferably vanadium, niobium, and hafnium, may be used with this process, the invention will be detailed below with reference to a tantalum and/or tantalum nitride liner and barrier scheme. Material differences between tantalum and other metals will be noted as necessary in the detailed description.

The process deposits a metal or metal nitride layer, e.g., a liner/barrier layer, on a substrate in a processing chamber. The substrate used for the decomposition process can be of any material, usually either metallic or ceramic, on which an adherent metallic film can be formed and which can be heated to a temperature above the decomposition temperatures of the precursor compounds. Thus, the substrate can be a ceramic material such as glass, thermal oxides, or quartz, or a metal such as iron, nickel, titanium, tungsten, copper, or aluminum. The substrate must be a solid at the decomposition temperature of the precursor. The substrate may also comprise patterned wafers including those having dielectric layers such as silicon and metal layers such as aluminum and can include a series of underlying layers and interconnects of various materials. When the desired substrate or substrate surface has a melting or softening point below about 1000° C., such as in the case of aluminum, certain other metals, and most glasses, a precursor compound whose decomposition temperature is lower than the melting or softening point of the desired substrate must be used.

FIG. 1 is a schematic cross-sectional view of an exemplary metallized film stack 100 of the invention having a liner layer 118, a barrier layer 119, and conducting metal layer 120 deposited in a feature 116 formed on a substrate 112. The feature 116 is formed by depositing and etching a dielectric layer 114 on the substrate 112 to form the desired aspect of the feature 116, such as a via, contact, trench, or line. The dielectric layer 114 can be a pre-metal dielectric layer deposited over a silicon wafer or an inter-level dielectric layer, and is formed over the underlying substrate 112 in accordance with procedures conventionally known in the art to form a part of the overall integrated circuit. Once the dielectric layer 114 is deposited, the dielectric layer 114 can be etched with any dielectric etching or patterning process known in the art, preferably reactive ion etching techniques.

The liner layer 118 of the invention is deposited from the organometallic precursor conformably on the dielectric layer 114 and on the floor and walls of the feature 116. The liner layer 118 improves adhesion between the substrate or dielectric layer 114 and the subsequently deposited conducting metal layer 120. The liner layer 118 is preferably deposited by either thermal decomposition or plasma enhanced decomposition of a tantalum precursor in the presence of a processing gas to form a metal layer. For the tantalum liner layer, the deposition rate is preferably from about 30 angstroms (Å) to about 50 Å per minute, with a total layer thickness preferably from about 50 Å to about 100 Å thick.

Thermal decomposition of the precursor involves heating the substrate to a temperature sufficiently high to cause the hydrocarbon portion of the volatile metal compound adjacent the substrate to decompose to volatilize hydrocarbons which desorb from the substrate while leaving the metal on the substrate. The addition of a reactant gas allows a greater deposition rate and the decomposition of the precursor is accelerated by the presence of reactant species. The exact temperature will depend upon the identity and chemical, thermal, and stability makeup of the organometallic precursor and processing gases used under the deposition conditions. However, a temperature from about room temperature to about 1000° C. is contemplated for the thermal decomposition of the precursor of the invention. The substrate is heated to a temperature between about 100° C. to about 450° C., preferably between about 250° C. to about 450° C., and most preferably a temperature of 400° C. is used to ensure a complete reaction between the precursor and the reacting gas on the substrate surface.

For plasma-enhanced CVD deposition of the precursor, power to generate a plasma is then either capacitively or inductively coupled into the chamber to excite the plasma gases into excited neutral ions and the like which result in a deposit film on the substrate. The power is provided to the processing gases at about 200 to about 1000 Watts, with about 750 Watts most preferably used. The chamber pressure is maintained between about 100 milliTorr and about 20 Torr during the plasma enhanced deposition process. The plasma enhanced decomposition of the precursor allows for an increased deposition rate, particularly in combination with a reactant gas, at a lower substrate temperature as the energy to enable decomposition of the precursor is supplied externally by a power supply. For a plasma enhanced deposition process the temperature of the substrate is preferably between, about 100° C. to about 450° C., and most preferably between about 250° C. to about 450° C.

The organometallic precursor for a tantalum film is introduced into the chamber at a flow rate of between about 5 and about 50 sccm, while the processing chamber is preferably maintained at a pressure between about 100 milliTorr to about 250 milliTorr, and more preferably at about 150 milliTorr. If the precursor cannot be delivered to the chamber as a gas, the precursor can be dissolved in a solvent and vaporized for delivery to the chamber. Aliphatic hydrocarbon based solvents such as hexane and octane are preferably used when the precursor are delivered to the processing chamber by a liquid delivery system. For precursors delivered to the chamber as a vaporized fluid, a molar, ratio of 1:1 of precursor and solvent is preferably used, however, the molar ratio may vary according to the processing condition of the deposition process and the composition of the precursor. For a vaporized precursor, the flow rates to the chamber are between about 5 and about 50 sccm, and the chamber pressure for deposition is preferably from about 100 milliTorr to about 1 Torr.

Processing gases are introduced into the chamber at a flow rate of between about 5 and about 50 sccm, with the flow rate is preferably being maintained to produce a molar ratio of 1:1 of precursor and reactant gas, however, the molar ratio may vary according to the processing condition of the deposition process and the composition of the precursor. The processing gases preferably comprise non-nitrating gases such as argon, hydrogen and combinations thereof. In an alternative embodiment, the metal film can be deposited in the presence of a non-reactant gas, such as argon.

NON-conducting contaminants, such as carbon and oxygen impurities, in the deposited tantalum liner layer 118 may produce a film with high film resistivities and poor barrier properties. Therefore, a post-deposition plasma treatment is preferably performed to remove impurities, densify the film, and decrease the liner layer's resistivity. The plasma may have the same composition as the processing gas during deposition. For the metal liner layer 118, a non-nitrating plasma gas is used, preferably of the same composition as the process in gas and any inert gases in the chamber. For tantalum deposition, the plasma gas, is argon, hydrogen, and combinations thereof. In an alternative embodiment, an argon plasma is used, preferably subsequent to depositing a metal film in an argon gas. The preferred carrier gas of the vaporized tantalum precursor is argon. Hydrogen species in the plasma react with the carbon impurities to produce volatile hydrocarbons that can easily desorb from the substrate surface and can be purged from the processing zone and processing chamber. The plasma further bombards the oxygen contained in the film to break oxygen bonds and produce oxygen radicals which also desorb from the film. By using an in situ plasma of the same composition as the reactant and carrier gases, no new production steps are required for the metallization process and a higher substrate throughput is achieved.

The chamber pressure for the plasma treatment of the film is between about 50 milliTorr to about 10 Torr. The substrate temperature during the plasma step is preferably about the same temperature range as for the precursor decomposition temperature range, preferably from about 100° C. to about 450° C., and most preferably 250° C. to about 450° C. Power to generate a plasma is then either capacitively or inductively coupled into the chamber to excite the plasma gases into excited neutrals and the like which react with the deposited film on the substrate. The power is provided to the processing gases at about 200 to about 1000 Watts, with about 750 Watts most preferably used.

Referring to FIG. 1, the barrier layer 119 preferably composed of a tantalum nitride ($Ta_xN_y$, wherein x and y are integers representing the different phases of tantalum nitride films, such as TaN and $T_3N_5$) film conformally deposited by the thermal decomposition of a $(Cp(R)_n)_xMH_{y-x}$ precursor of the invention, such as $((Si(CH_3)_3)C_5H_4)_2TaH_3$ in the presence of a reactant gas, such as hydrogen, on the liner layer 118. The tantalum nitride barrier layer 119 may comprise a tantalum carbon nitride or tantalum silicon nitride film. The barrier layer 119 is deposited prior to the conducting metal layer 120 to prevent diffusion from the conducting metal layer 120 to the underlying substrate 112 or dielectric layer 114. The barrier layer 119 is preferably deposited by decomposition of a tantalum precursor of the invention, such as $((Si(CH_3)_3)C_5H_4)_2TaH_3$ in the presence of a nitrating reactant gas, such as ammonia, to form a tantalum nitride barrier layer 119. Preferably, the same precursor is used for the deposition of both the metal and metal nitride layers. The nitrating reactant gas are preferably nitrogen, ammonia, nitrogen and hydrogen, and combinations thereof, most, preferably ammonia. The same precursor deposited with different processing gas compositions allows for metal and metal nitride depositions to occur in the same chamber under similar processing conditions resulting in faster substrate throughput and minimal contamination.

The organometallic precursor for a tantalum nitride film is introduced into the chamber at a flow rate of between about 5 and about 50 sccm. The processing chamber pressure is maintained at a pressure between about 100 milliTorr to about 10 Torr, preferably about 100 milliTorr to about 250 milliTorr, and most preferably about 150 milliTorr. If the precursor cannot be delivered to the chamber as a gas, the precursor can be dissolved in a solvent, such as hexane, and vaporized for delivery to the chamber. For precursors delivered to the chamber as a vaporized fluid, a molar ratio of 1:1 of precursor and solvent is preferably used, however, the molar ratio may vary according to the processing condition of the deposition process and the composition of the precursor. For a vaporized precursor, the flow rates to the chamber are similar, but the chamber pressure would preferably be from about 100 milliTorr to about 1 Torr.

The nitrating reactant gases, such as nitrogen and ammonia are introduced into the chamber at a flow rate of between about 5 and about 100 sccm. A molar ratio of 1:1 of precursor and nitrating reactant gas is preferably used, however, the molar ratio may vary according to the processing condition of the deposition process and the composition of the precursor. Non-reactant gases, such as the inert gases argon and helium, can also be present in the processing chamber during deposition.

It is believed that the barrier properties of a metal nitride film may be improved by incorporating silicon into the film to form a metal silicon nitride film. Silane can be used as a reactant gas in conjunction with nitrating reactant gases can deposit a metal silicon nitride layer, including tantalum silicon nitride (TaSiN) and niobium silicon nitride NbSiN). Since the composition of the reactant gas determines the amount of nitrogen included in the deposited film, control of the composition and amount of reactant gases can produce nitrogen free metal films or particular phases of metal nitride and metal silicon nitride films.

The reactant gas composition for the metal nitride layer determines the film's characteristics and properties. For conducting metal films, as the nitrogen content increases, the film becomes increasingly resistive, and in the case of tantalum nitride, a high nitrogen content will eventually transition a conducting phase to a. $Ta_3N_5$ insulating phase. As such, the nitrogen content of the reactant can be controlled to determine the amount of nitration in the deposited film. Preferably, inert gases, such as the carrier gases argon and helium, are used to tune the conditions by selecting precursors that favor more or less nitrogen as desired.

The tantalum nitride barrier layer 119 may be further exposed to a plasma to remove contaminants, density the film, and reduce the resistivity of the film. The plasma reduces the barrier layer's 119 conductive resistivity by the removal of non-conducting contaminants, such as carbon and oxygen, from the deposited film as carbon reacts with hydrogen and is removed as volatile hydrocarbons and oxygen is displaced and desorbed from the film by nitrogen or hydrogen. Removal of the contaminants will also provide for a denser film with fewer layering defects and improved barrier properties. Preferably, a plasma gas of the same composition as the reactant and carrier gases is used so no new processing steps are performed and a higher substrate throughput can be achieved. For nitrogen sensitive films, such as the tantalum nitride layer 119, a hydrogen or hydrogen and argon plasma is preferably used. The plasma is performed at a processing chamber pressure of about 50 milliTorr to about, 10 Torr with the plasma power is provided to the plasma gases at about 200 to about 1000 Watts, with about 750 Watts most preferably used. In general, the effectiveness of the plasma treatment depends on the thickness of the untreated film and plasma conditions. With a fixed plasma power and treatment time, the thinner the deposited film, the more effective the treatment. The post deposition plasma treatment has the further benefit of reducing temperature variations during sequential substrate depositions thereby eliminating the first wafer effect and maintaining a more stable processing regime.

Referring back to FIG. 1, a conducting metal layer 120, preferably copper, is deposited on the barrier layer 119 to fill the interconnect structure 116 and simultaneously cover the entire field region between adjacent features such as interconnect 116 with copper. The conducting metal layer 20 may comprise a seed layer of a conducting metal for a subsequent deposition of a metal layer by a electroplating or electroless process. The seed layer allows for a conducting metal, such as copper, to fill the feature 116 formed in the substrate without forming voids or other deposition discontinuities. Preferably, the barrier layer 119 functions as an seed layer for deposition of the conducting metal layer by an electroplating process to reduce processing steps for the metallization scheme. The copper layer 120 can be deposited by physical vapor deposition (PVD), ionized metal plasma (IMP) PVD, CVD, electroplating, electroless deposition, evaporation, or any other known methods in the art, but the copper layer 120 is preferably deposited by electroplating techniques. The feature 116 may be further processed by planarizing the top portion of the metallized film stack 100, preferably by chemical mechanical polishing (CMP). During the planarization process, portions of the copper layer 118 and the dielectric layer 114 are removed from the top of the structure leaving a fully planar surface with exposed upper surfaces of conductive features such as the via 116 therein.

A skilled practitioner in the art will understand the need to modify the metal and metal nitride deposition processes while retaining the basic nature of the processes for performance of the invention with respect to time, pressure, flow rates, plasma power, and temperature and regarding the use of variable equipment, processes, and desired film characteristics.

The Apparatus

The organometallic precursor is introduced into the processing chamber by either a liquid delivery system or a precursor vaporizer system. The organometallic precursor of the invention may be a liquid or a solid. In a liquid state, the precursor is delivered to the processing chamber by a liquid delivery system, and in a solid state, the precursor is delivered to the processing chamber by a precursor vaporizer system, where the vaporizer provides heat to vaporize or sublime the precursor.

For processing in a liquid delivery system, precursors with high viscosities may be first dissolved in an aliphatic hydrocarbon solvent, such as hexane or octane, to reduce the viscosity of the liquid precursor. The precursor, is then stored in an ampoule or storage container in the system until a pressurized inert gas forces the precursor into a processing liquid path such as by supplying the inert gas under pressure into the ampoule containing the precursor. A flow meter regulates the liquid precursor flow and the flow rate can be varied from 1 mg/min to 1000 mg/min, or any other amount needed for the deposition process. After flowing past the liquid flow meter, the precursor liquid is vaporized in a vaporizer and preferably injected into an inert carrier gas stream, such as helium or argon, for delivery to the processing chamber, preferably a CVD TxZ™ chamber available from Applied Materials of Santa Clara, Calif. The liquid delivery system vaporizer is often heated between about 50° C. to about 120° C. to facilitate the vaporization process.

Figure 2:
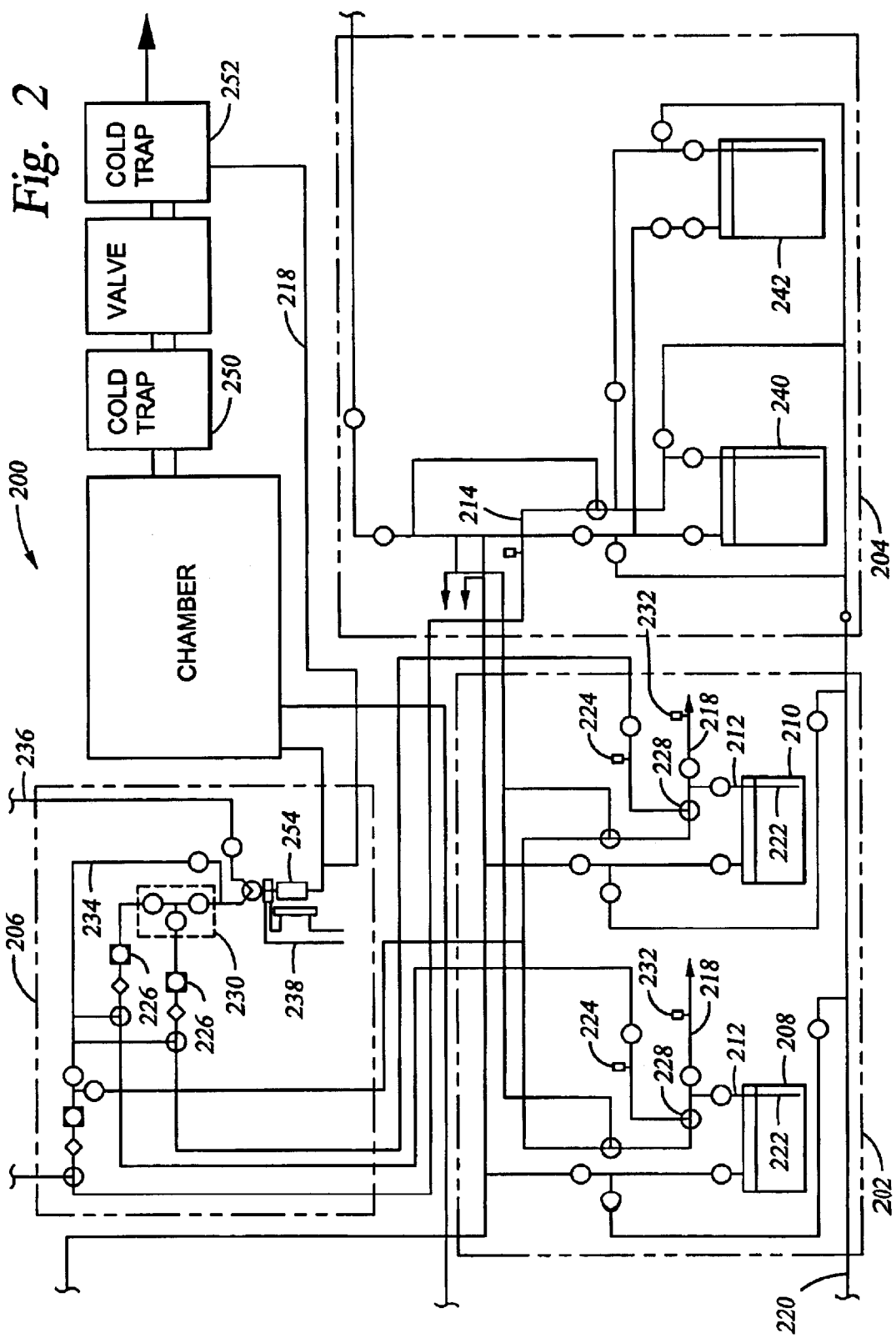
FIG. 2 is a schematic of a liquid delivery system.

FIG. 2 is a schematic view showing a liquid delivery system 200 of the invention. The liquid delivery system generally includes a liquid precursor module 202, a solvent module 204 and a vaporizer module 206. In one embodiment, the liquid precursor module 202 includes two pressurized ampoules 208, 210 and a liquid delivery line 212 connected to each ampoule. Valves are disposed along the length of the liquid delivery lines to control flow of liquid from the ampoules to a mixing port and then into the vaporizer and to prevent collection of precursor within the system which can negatively affect process stabilization and/or repeatability.

The ampoules are designed to deliver the liquid precursors at high pressure, e.g., up to 500 psi, without having to rely on high pressure pumps, i.e., no high cycle mechanical pump with drubbing parts exposed to precursors. To provide the pressure, an inert gas such as argon is charged into the ampoules at a pressure of about 90 psi through line 220. A liquid outlet line 222 is disposed in the ampoule so that as the inert gas, e.g., argon, is delivered to the ampoule and the appropriate valves are opened, the liquid is forced out through the outlet through a suitable valve and into the liquid delivery line.

The delivery line 212 is connected from each ampoule to the vaporizer 254. A first valve is disposed on the outlet of the ampoule to control delivery of the liquid to the delivery line 212. The valve is preferably a three-way valve connecting the bypass line 218 and the liquid delivery line 212. The bypass line 218 in turn is connected to a second cold trap 252 and an exhaust manifold (not shown). A high pressure gauge 224 and a liquid flow controller (LFC) 226 are disposed downstream from a valve 228 introducing the solvent and the purge gas. The LFC controls delivery of the liquid to the mixing port 230 connected between the liquid precursor delivery lines. A low pressure gauge 232 is disposed on the bypass line 218 to monitor pressure in the line so that completion of the maintenance routine can be determined.

The liquid precursor delivery lines 212 deliver liquid precursors into the mixing port 230 upstream from the vaporizer 254. A solvent delivery line 234 also delivers a solvent into the liquid delivery line downstream from the mixing port where the liquid precursors and the solvent are mixed and delivered into the vaporizer. At the vaporizor 254, a carrier gas line 236 delivers a carrier gas into the delivery line to carry the liquid precursors and the solvent into the vaporizer 254 through the capillary tube or nozzle. In addition, a concentric carrier gas line 238 delivers a carrier gas around the nozzle or injection tip to ensure that even a small amount of liquid is delivered to the vaporizing surfaces. The delivery line from the mixing port and into the vaporizer is preferably made of a material having a low coefficient of friction, such as Teflon PTFE, and does not hang up in the line. This feature assists in the delivery of small volumes of liquid precursor.

The solvent module 204 includes one or more chargeable ampoules similar to the liquid precursor ampoules. Preferably, there are two solvent ampoules 240, 242 and two liquid precursor ampoules 208, 210. The liquid precursor ampoules can deliver two separate precursors which can be mixed at the mixing port or can deliver the same precursor together or alternatively.

The liquid precursor ampoules are designed with a slotted/sculptured bottom to draw the liquid downwardly in the ampoule so that the liquid may (1) be detected at very low levels and (2) be drawn out of the ampoule even at low levels. This is particularly important in dealing with expensive liquids which are preferably not wasted. In addition, the ampoules include an ultrasonic detector for discerning the volume of liquid in the ampoule even at low levels so that continuous processing may be achieved.

An optional cold trap 250 is disposed in the conduit connecting the exhaust pump to filter out the deposition material which may be detrimental to the pump. Additionally, a second cold trap 252 is disposed downstream from the first cold trap and is connected to a bypass line 218 from the vaporizer. The bypass line 218 and related cold trap 252 allow the system to operate in a continuous flow made by allowing delivery of vaporized material thereto during substrate transfer and plasma processing. By this method, the system may continually vaporize precursors but deliver the vaporized material to the processing chamber for deposition or to the exhaust system through a bypass line. The continual flow of the vaporized precursor enables stabilization of the deposition process over a number of substrates by providing consistent deposition processing conditions through optimization and maintenance of the vaporization process.

Improved filtration of the deposition material may be accomplished by providing a cold trap 252 comprising a cold unit and a hot unit (not shown). The cold unit of the cold trap provides for removal of particulate material by condensation on the cold trap surface. The hot unit provides for removal of unreacted precursor vapor by having a temperature, above the degradation temperature of the deposition precursor, thereby depositing the precursor material on the unit.

Figure 3:
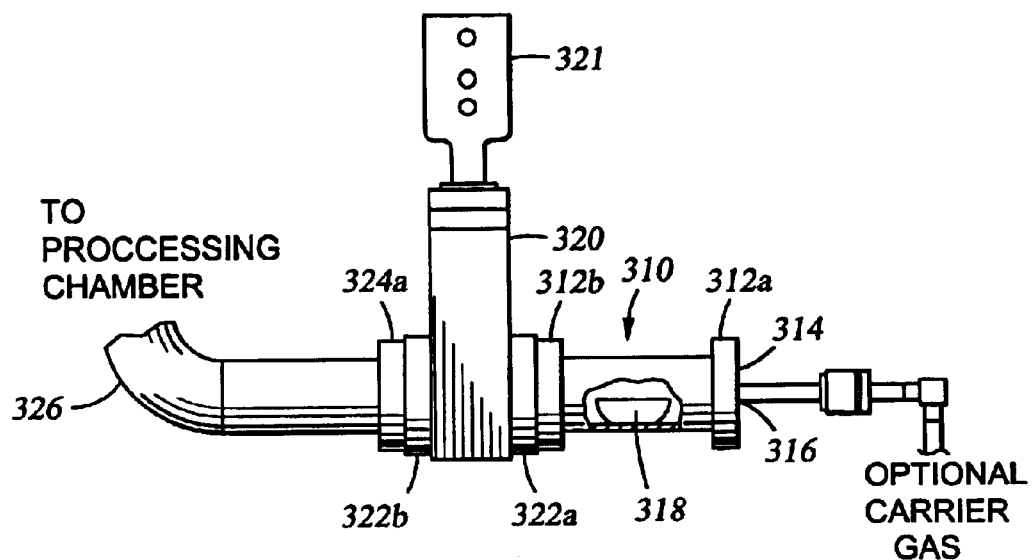
FIG. 3 is a partially sectioned view of a precursor vaporization apparatus showing a vaporizer supplying reactive vapors into the deposition chamber.

FIG. 3 shows a precursor vaporizer system, where a vaporizer 310 is provided to heat and vaporize or sublime the precursor. The vaporizer 310 generally comprises a metal cylinder of stainless steel or aluminum. A heated pressure gauge (not shown) is located in the vaporizer to monitor the pressure of the vaporizer to insure that a continuous feed of particulate solid or liquid precursor is provided to the vaporizer 310. The pressure gauge is preferably heated so that material will not deposit or decompose on the gauge and render the gauge inoperable.

One embodiment of a vaporization chamber or vaporizer 310 is shown heating the starting material to vaporize or sublime a liquid or solid precursor material before introducing it into the deposition chamber or blending it with another precursor. A gas inlet port 316 permits the flow of a non-reactive gas into vaporizer 310. A gate valve 320 separates the vaporizer 310 from the processing chamber (not shown). Within vaporizer 310, as shown in FIG. 3, is a containment vessel 318 for placement of the precursor. The containment vessel 318, which may rest on the inner surface of the vaporizer 310, is made of a non-reactive material, usually a ceramic material, and preferably comprises quartz. Alternatively, an inert gas may be bubbled (not shown) provided to the containment vessels to enhance vaporization of the precursors of the invention.

The pressure in vaporizer 310 may be maintained at atmospheric pressure, but for the chemical vapor deposition process, the pressure is preferably maintained from about 30 milliTorr to about 10 Torr, or any suitable pressure used by the CVD processing chamber for deposition of the precursor. The increase in total pressure up to 10 Torr increases the deposition rate of the precursor and allows better control of the amount of precursor that is provided to the deposition chamber. The carrier gas can be any inert gas, preferably helium or argon, and most preferably argon.

The temperature of vaporizer 310, when operated within the previously described pressure ranges, will usually vary from a minimum temperature below which the material will not vaporize, at the pressure required for deposition, up to a maximum temperature below the temperature at which the vaporized material will decompose, at the operative pressure. The substituent groups on the precursor have a strong influence on the boiling point and decomposition temperature of the precursor, which provides for operating temperature that reflect the decomposition temperatures of the individual precursors. While the operating temperature of the vaporizer will vary according to the material to be vaporized, the temperature is preferably maintained between about 50° C. and about 200° C.

Figure 4:
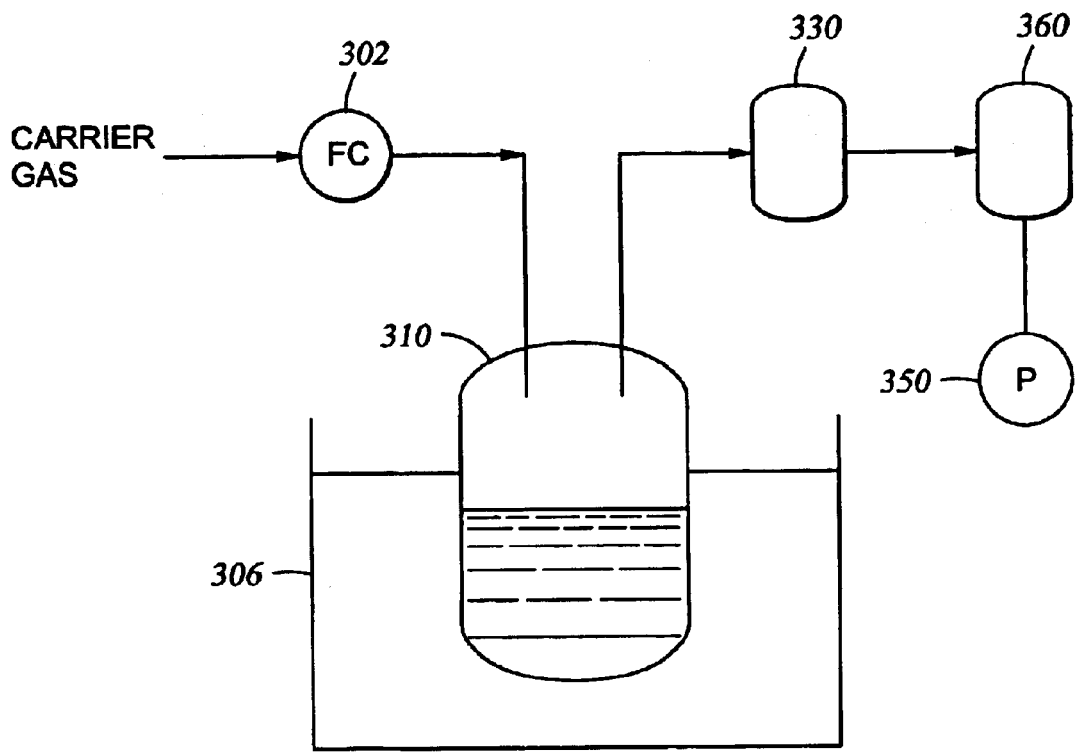
FIG. 4 is a schematic view of a carrier gas delivery system for transporting a precursor material from a vaporizer to a deposition chamber.

An alternative embodiment for the vaporizer 310 is shown in FIG. 4 wherein a thermostatic oven 306 heats the vaporizer 310 which contains, for example, non-vaporized and vaporized precursor. The carrier gas is passed through a flow controller 302 such as a metering pump or a needle valve and is bubbled through the non-vaporized precursor in the vaporizer 310. The combined carrier gas and vaporized precursor are then passed to the processing chamber by a rough pump 350. A mass flow meter (not shown) can be placed anywhere between the vaporizer 310 and the deposition chamber to measure the total mass leaving the vaporizer 310. The flow rate of precursor can then be calculated by subtracting the mass of carrier gas sent to the vaporizer 310 from the mass of material leaving the vaporizer 310.

Figure 5:
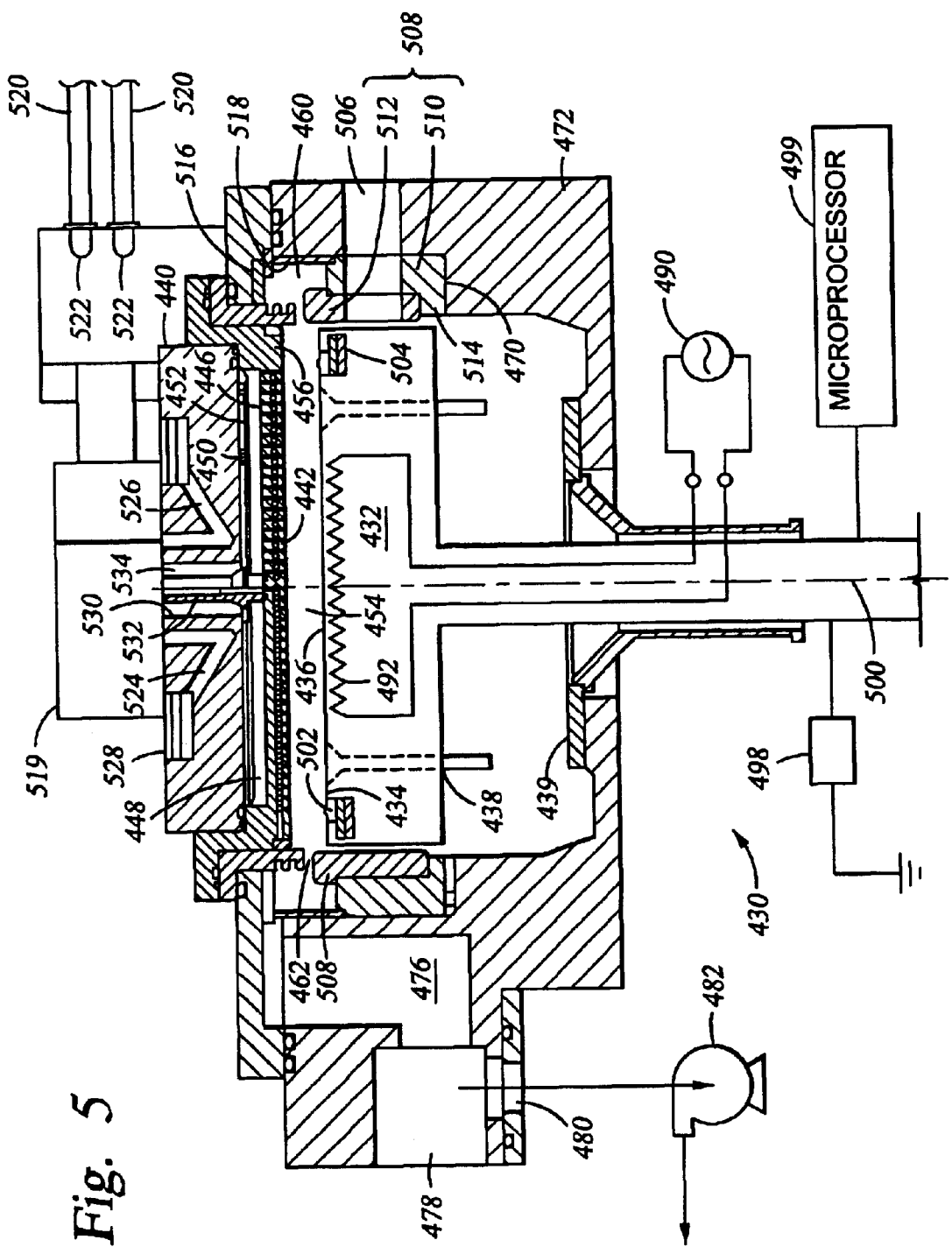
FIG. 5 is a schematic cross-sectional view of a CVD chamber suitable for performing the CVD deposition processes of the present invention chamber.

Referring to FIG. 5, a schematic cross-sectional view of a suitable CVD plasma for performing the processes of the invention is shown. The methods of the invention are preferably carried out in a processing chamber that has been programmed to process a substrate accordingly. A preferred CVD chamber is known as the CVD. TxZ chamber and is available commercially from Applied Materials, Inc., of Santa Clara, Calif. The CVD. TxZ chamber is suitable for the deposition of an organometallic precursor of the invention in the presence of a reactant gas for depositing a metal and/or metal nitride layer by either the thermal or plasma enhanced decomposition process.

In a preferred embodiment of the processing chamber, a dual manifold distributor, or showerhead 440, provides for the introduction of the precursor and of the reactant gases to the processing zone. An exemplary dual manifold showerhead is shown in U.S. patent application Ser. No. 09/207, 780, entitled "Dual Channel Gas Distribution Plate", filed on Dec. 9, 1998, which is assigned to common assignee and incorporated herein by reference.

In the thermal or heat decomposition deposition process, an organometallic precursor gas of the invention, is injected into the chamber though the showerhead 440 at a preferable pressure from about 100 milliTorr to about 10 Torr which pedestal 432 holds the substrate 436 at an elevated temperature above the decomposition temperature of the organometallic precursor of about 100° C. to about 450° C., preferably from about 250° C. to about 450° C. The reactant gas is introduced into the system through a second manifold in the shower head 440 to a volume located directly above the substrate for film deposition. Thereby, a metal and/or metal nitride layer is conformally deposited on the substrate 436 in a CVD process. The heat decomposition process is a thermal process not usually relying upon plasma excitation of the precursor gas. If a plasma is desired during the deposition process or as a post deposition plasma treatment to remove impurities and density the film, sufficient voltage and power is applied by the RF source 494 to cause the process gas in the processing region 456 between the showerhead 440 and the pedestal 432 to discharge and to form a plasma.

The CVD chamber 430 includes a pedestal 432 supporting a substrate 436 on a supporting surface 434 to be deposited by CVD with a layer of material, such as a TaN layer of the invention. Lift pins 438 are slidable within the pedestal 432 but are kept from falling out by conical heads on their upper ends. The lower ends of the lift pins 438 are engageable with vertically movable lifting ring 439 and thus can be lifted above the surface 434 of the pedestal 432. The surface 434 has a smaller diameter than that of the substrate 436 resting thereon. With pedestal 432 in a lower loading position (slightly lower than a slit valve identified as "506" below), a robot blade (not shown) in cooperation with the lift pins 438 and the lifting ring 439 transfers the substrate 436 in and out of the chamber 430 through the slit valve 506, which can be vacuum-sealed to prevent the flow of gas into or out of the chamber through slit valve 506. Lift pins 438 raise an inserted substrate 436 off the robot blade and allowing the blade to retract from the chamber, and then the pedestal 432 rises to transfer the substrate 436 from the lift pins 438 onto the supporting surface 434 of the pedestal 432. A suitable robotics transfer assembly is described in commonly assigned U.S. Pat. No. 4,951,601, issued to Maydan, the complete disclosure of which is incorporated herein by reference.

The process gas is injected into the reactor 430 through a central gas inlet 530 in a gas-feed cover plate 446 which houses a coaxially disposed gas delivery conduit 532. The conduit 532 channels a second gas into the processing region 454, which is received at a lower end of the conduit 532, and delivers a gas to the second gas pathway (not shown), which includes the second set of horizontal channels. The central bore 530 and the outer perimeter of the conduit 532 define a gas delivery passage 534, such as an annulus, which delivers a gas above the perforated blocker plate 452 to a first disk-shaped space or region 448 and from thence through passageways 450 in a baffle plate (or a gas blocker plate) 452 to a second disk-shaped space or region 454 in back of the showerhead 440. The showerhead 440 includes a large number of holes or passageways 442 for jetting the process gases into a processing region or zone 456. More specifically, process gas passes from the space or void 454, through the passageways 442 and into the processing space or zone 456 and towards the substrate 436.

The process gas jets from the holes 442 in the showerhead 440 into the processing space or zone 456 between the showerhead 440 and pedestal 432 so as to react at the surface of the substrate 436. The process gas byproducts subsequently flow radially outwardly with respect to a central axis 500 across the edge of the substrate 436, and across a peripheral centering right 502 which is disposed in an annular ledge 504 recessed in the upper periphery of a pedestal 432. Then into an annular pumping channel 460 surrounding the upper periphery of the pedestal 432 when pedestal 432 is in the processing position.

The pumping channel 460 is connected through a constricted exhaust aperture 462 to a pumping plenum 476, and a valve 478 gates the exhaust through an exhaust vent 480 to a vacuum pump 482. The restricted choke aperture 462 creates a nearly uniform pressure around the circumferential pumping channel 460. The process gas and its reaction byproducts flow from the center of the showerhead 440 across the substrate 436 and the periphery of the pedestal 432 and then through the choke aperture 462 to the pumping channel 460. The gas then flows circumferentially in the pumping channel 460 to the exhaust aperture 474 and then through the exhaust plenum 476 and the exhaust vent 480 to the vacuum pump 482. Because of the restriction 462 the gas flow across the substrate 436 is nearly uniform in the azimuthal direction.

As shown in FIG. 5, the ledge 470 in the chamber body 472 supports an insulating annular chamber insert 508 composed of a insulating chamber ring 510 and a band shield 512, which forms the bottom of the pumping channel 460. The chamber lid rim 466 forms the top and part of the outside wall of the pumping channel 460 along with the part of the chamber body 472. The inside upper edge of the pumping channel 460 is formed by the isolator ring 464, which is made of a ceramic or other electrically insulating material which insulates the metallic showerhead 40 from the chamber body 472.

The CVD reactor 430 of FIG. 5 can be operated in two modes, thermal and plasma-enhanced. In the thermal mode, an electrical power source 490 supplies power to a resistive heater 492 at the top of the pedestal 432 to thereby heat the pedestal 432 and thus the substrate 436 to an elevated temperature sufficient to thermally activate the CVD deposition reaction. In the plasma-enhanced mode, an RF electrical source 494 is passed by a switch 496 to the metallic showerhead 440, which thus acts as an electrode. The showerhead 440 is electrically insulated from the lid rim 466 and the main chamber body 472 by the annular isolator ring 464, typically formed of an electrically non-conductive ceramic. The pedestal 432 is connected to a biasing element 498 associated with the RF source 494 so that RF power is split between the showerhead 440 and the pedestal 432. Sufficient voltage and power is applied by the RF source 494 to cause the process gas in the processing region 456 between the showerhead 440 and the pedestal 432 to discharge and to form a plasma. A microprocessor controller 499 is provided to monitor and control the deposition processes performed in the chamber 430.

The generally illustrated chamber insert 508 includes an L-shaped insulating ceramic ring 510 resting on the inside ledge 470 of the main chamber body 472 and also includes an annular or band shield 512 resting on an inside ledge 514 on the L-shaped ring 510 and spaced from the pedestal 432 and the centering ring 502 by a small gap. Ceramic chamber liners of themselves are well known, for example, as described by Robertson et al. in U.S. Pat. No. 5,366,585 incorporated herein by reference thereto. The band shield 512 is preferably made of a metal, such as aluminum, and extends vertically upwardly substantially above the top of the L-shaped ceramic ring 510 and to a lesser extent above the supporting surface 434 of the pedestal 432.

The lid liner 516 is metallic and is both thermally and electrically connected to the lid rim 466, effectively forming an extension of it, and because of its remote location does not easily affect the plasma in the processing region 456. Any metal depositing on the lid liner 516 will not further affect the plasma as long as the metal does not extend over the isolator ring 464. In any case, the lid liner 516 is easily removed by means of a fastener (not shown) when it becomes excessively coated.

The centering ring 502 performs two functions. It acts to precisely center the substrate 436 on the pedestal 432, the substrate 436 having been transferred into the chamber and onto the pedestal 432 by a robot blade (not shown) moving through the slit valve 506. This function blends with a retaining function in which the peripheral centering ring 502 acts as a retaining ring to bold the substrate 536 within its opening. Additionally, the centering ring 502 acts as a thermal blanket for the portion of the pedestal 432 exposed outside of the substrate 436. Specifically, its thermal characteristics are designed in view of the intended process so that the centering ring 502 thermally floats relative to the heated pedestal 432 and remains relatively cool compared to the substrate 436 and significantly cooler than the underlying pedestal 432, and thus little material is deposited on it during thermal CVD processing.

Figure 6:
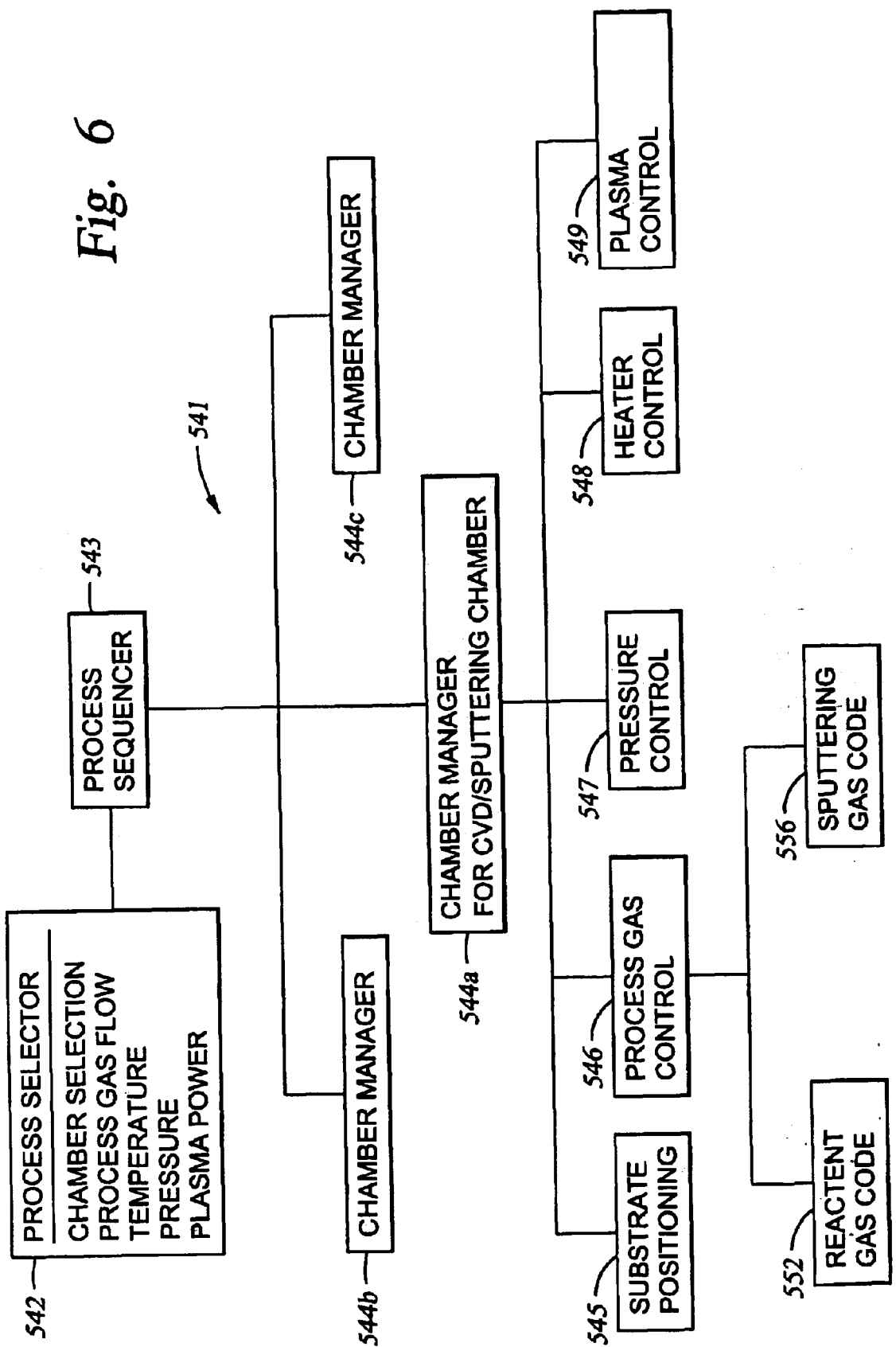
FIG. 6 is a simplified block diagram showing the hierarchical control structure of a computer program of the present invention.

FIG. 6 shows an illustrative block diagram of the hierarchical control structure of the computer program 541 of the microprocessor controller 499. A user enters a process set number and process chamber number into a process selector subroutine 542 in response to menus or screens displayed on the CRT monitor by using the light pen interface. The process sets are predetermined sets of process parameters necessary to carry out specified processes, and are identified by predefined set numbers. Process selector subroutine 542 identifies (i) the desired process chamber in a multi-chamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing a light pen/CRT monitor interface (not shown).

A process sequencer subroutine 543 comprises program code for accepting the identified process chamber and set of process parameters from the process selector subroutine 542, and for controlling operation of the various process chambers. Multiple users can enter process set numbers and process chamber numbers, or a user can enter multiple process set numbers and process chamber numbers, so the sequencer subroutine 543 operates to schedule the selected processes in the desired sequence. Preferably the sequencer subroutine 543 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 543 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 543 determines which process chamber and process set combination is going to be executed next, sequencer subroutine 543 causes execution of the process set by passing the particular process set parameters to a chamber manager subroutine 544A–C, which controls multiple processing tasks in CVD chamber 430 and possibly other chambers (not shown) according to tile process set determined by sequencer subroutine 543.

Once the sequencer subroutine 543 determines which process chamber and process set combination is going to be executed next, the sequencer subroutine 543 causes execution of the process set by passing the particular process set parameters to the chamber manager subroutines 544A–C which control multiple processing tasks in different process chambers according to the process set determined by the sequencer subroutine 543. For example, the chamber manager subroutine 544A comprises program code for controlling CVD process operations, within the described process chamber 430 of FIG. 5.

The chamber manager subroutine 544 also controls execution of various chamber component subroutines or program code modules, which control operation of the chamber components necessary to carry out the selected process set. Examples of chamber component subroutines are substrate positioning subroutine 545, process gas control subroutine 546, pressure control subroutine 547, heater control subroutine 548, and plasma control subroutine 549. Those having ordinary skill in the art will recognize that other chamber control subroutines can be included depending on what processes are desired to be performed in chamber 430 (shown in FIG. 5). In operation, chamber manager subroutine 544A selectively schedules or calls the process component subroutines in accordance with the particular process set being executed. Scheduling by chamber manager subroutine 544A is preformed in a manner similar to that used by sequencer subroutine 543 in scheduling which process chamber and process set to execute. Typically chamber manager subroutine 544A includes steps of monitoring the various chamber components, determining which components need to be operated based on the process parameters for the process set to be executed, and causing execution of a chamber component subroutine responsive to the monitoring and determining steps.

Hypothetical Examples

The following hypothetical examples illustrate the best mode contemplated by the invention. The following hypothetical examples illustrate deposition of metal and metal nitride films by precursors of the invention. The examples may be performed in a chemical vapor deposition chamber, and in particular, a "CENTURA TxZ" system capable of both thermal decomposition and plasma enhanced chemical vapor deposition processes as described above, and sold by Applied Materials, Inc., Santa Clara, Calif.

Tantalum Precursor Formation:

Precursors of the invention generally have the formula $(Cp(R)_n)_x MH_{y-x}$, for which preferred precursors, such as $(Si(CH_3)_3)C_5H_4)_2 TaH_3$, can be formed when Cp is cyclopentadienyl, —($C_5H_4$), R is trimethysilyl, $Si(CH_3)_3$, n is one, x is two, M is tantalum, y is 5, and y−x is 3.

Tantalum Film Deposition: Thermal Decomposition:

A tantalum (Ta) film is deposited at a chamber pressure of 150 milliTorr and temperature of 400° C. from reactive gases which flow into the reactor as follows:

| | |
|---|---|
| $((Si(CH_3)_3)C_5H_4)_2$ TaH$_3$, at bis(trimethylsilylcyclopentadienyl) trihydrotantalum | 25 sccm |
| Hydrogen, H$_2$, at | 25 sccm |
| Argon, Ar, at | 100 sccm. |

A subsequent plasma treatment at a chamber pressure of 150 milliTorr with 750 W of high frequency power (13 MHz) is applied to the showerhead for contaminant removal from the deposited tantalum layer, the plasma gases flow into the reactor as follows:

| | |
|---|---|
| $((Si(CH_3)_3)C_5H_4)_2$ TaH$_3$, at bis(trimethylsilylcyclopentadienyl) trihydrotantalum | 0 sccm |
| Hydrogen, H$_2$, at | 25 sccm |
| Argon, Ar, at | 125 sccm. |

Tantalum Film Deposition in the Absence of Reactant Gases:

A tantalum (Ta) film is deposited at a chamber pressure of 150 milliTorr and temperature of 400° C. from reactive gases which flow into the reactor as follows:

| | |
|---|---|
| $((Si(CH_3)_3)C_5H_4)_2$ TaH$_3$, at bis(trimethylsilylcyclopentadienyl) trihydrotantalum | 25 sccm |
| Argon, Ar, at | 100 sccm. |

A subsequent plasma treatment at a chamber pressure of 150 milliTorr with 750 W of high frequency power (13 MHz) is applied to the showerhead for contaminant removal from the deposited tantalum layer, the plasma gases flow into the reactor as follows:

| | |
|---|---|
| $((Si(CH_3)_3)C_5H_4)_2$ TaH$_3$, at bis(trimethylsilylcyclopentadienyl) trihydrotantalum | 0 sccm |
| Argon, Ar, at | 125 sccm. |

Tantalum Film Deposition Vaporized Precursor from a Liquid Delivery System:

A tantalum (Ta) film is deposited by a vaporized precursor with a 1:1 molar ratio of $(C_5H_5)_2 TaA_3$, bis(cyclopentadienyl)trihydrotantalum to hexane solvent at a chamber pressure of 1 Torr and at a temperature of 400° C. from vaporized precursors and reactive gases which flow into the reactor as follows:

| | |
|---|---|
| $((Si(CH_3)_3)C_5H_4)_2$ TaH$_3$, at bis(trimethylsilylcyclopentadienyl) trihydrotantalum | 25 sccm |
| Hexane, at | 25 sccm |
| Hydrogen, H$_2$, at | 25 sccm |
| Argon, Ar, at | 100 sccm. |

A subsequent plasma treatment at a chamber pressure of 1 Torr with 750 W of high frequency power (13 MHz) is applied to the showerhead for contaminant removal from the deposited tantalum layer, the plasma gases flow into the reactor as follows:

| | |
|---|---|
| $((Si(CH_3)_3)C_5H_4)_2$ TaH$_3$, at bis(trimethylsilylcyclopentadienyl) trihydrotantalum | 0 sccm |
| Hexane, at | 0 sccm |
| Hydrogen, H$_2$, at | 0 sccm |
| Argon, Ar, at | 125 sccm. |

Tantalum Film Deposition: Plasma Enhanced Decomposition:

A tantalum (Ta) film containing silicon is deposited at a chamber pressure of 150 milliTorr, temperature of 400° C., and a plasma power of 750 W of high frequency power (13 MHz) from reactive gases which flow into the reactor as follows:

| ((Si(CH$_3$)$_3$)C$_5$H$_4$)$_2$ TaH$_3$, at bis(trimethylsilylcyclopentadienyl) trihydrotantalum | 25 sccm |
|---|---|
| Hydrogen, H$_2$, at | 25 sccm |
| Argon, Ar, at | 100 sccm. |

A subsequent plasma treatment at a chamber pressure of 150 milliTorr with 750 W of high frequency power (13 MHz) is applied to the showerhead for contaminant removal from the deposited tantalum layer, the plasma gases flow into the reactor as follows:

| ((Si(CH$_3$)$_3$)C$_5$H$_4$)$_2$ TaH$_3$, at bis(trimethylsilylcyclopentadienyl) trihydrotantalum | 0 sccm |
|---|---|
| Hydrogen, H$_2$, at | 25 sccm |
| Argon, Ar, at | 125 sccm. |

Tantalum Carbon Nitride Film Deposition:

A tantalum carbon nitride (TaCN) film is deposited at a chamber pressure of 150 milliTorr and temperature of 400° C. from reactive gases which flow into the reactor as follows:

| ((Si(CH$_3$)$_3$)C$_5$H$_4$)$_2$ TaH$_3$, at bis(trimethylsilylcyclopentadienyl) trihydrotantalum | 25 sccm |
|---|---|
| Ammonia, NH$_3$, at | 25 sccm |
| Argon, Ar, at | 100 sccm. |

Tantalum Nitride Film Deposition by Ammonia:

A tantalum nitride (TaN) film is deposited at a chamber pressure of 150 milliTorr and temperature of 400° C. from reactive gases which flow into the reactor as follows:

| ((Si(CH$_3$)$_3$)C$_5$H$_4$)$_2$ TaH$_3$, at bis(trimethylsilylcyclopentadienyl) trihydrotantalum | 40 sccm |
|---|---|
| Ammonia, NH$_3$, at | 40 sccm |
| Helium, He, at | 50 sccm. |

A subsequent plasma treatment at a chamber pressure of 150 milliTorr with 750 W of high frequency power (13 MHz) is applied to the showerhead for contaminant removal from the deposited tantalum nitride layer, the plasma gases flow into the reactor as follows:

| ((Si(CH$_3$)$_3$)C$_5$H$_4$)$_2$ TaH$_3$, at bis(trimethylsilylcyclopentadienyl) trihydrotantalum | 0 sccm |
|---|---|
| Ammonia, NH$_3$, at | 0 sccm |
| Helium, He, at | 130 sccm. |

Tantalum Silicon Nitride Film Deposition:

A tantalum nitride (TaSiN) film is deposited at a chamber pressure of 150 milliTorr and temperature of 400° C. from reactive gases which flow into the reactor as follows:

| ((Si(CH$_3$)$_3$)C$_5$H$_4$)$_2$ TaH$_3$, at bis(trimethylsilylcyclopentadienyl) trihydrotantalum | 25 sccm |
|---|---|
| Nitrogen, N$_2$, at | 25 sccm |
| Silane, SiH$_4$, at | 25 sccm |
| Argon, Ar, at | 75 sccm. |

A subsequent plasma treatment at a chamber pressure of 150 milliTorr with 750 W of high frequency power (13 MHz) is applied to the showerhead for contaminant removal from the deposited tantalum silicon nitride layer, the plasma gases flow into the reactor as follows:

| ((Si(CH$_3$)$_3$)C$_5$H$_4$)$_2$ TaH$_3$, at bis(trimethylsilylcyclopentadienyl) trihydrotantalum | 0 sccm |
|---|---|
| Nitrogen, N$_2$, at | 0 sccm |
| Silane, SiH$_4$, at | 0 sccm |
| Argon, Ar, at | 150 sccm. |

Niobium Nitride Film Deposition:

A niobium nitride (Nb$_3$N$_4$) film is deposited at a chamber pressure of 150 milliTorr and temperature of 400° C. from reactive gases which flow into the reactor as follows:

| ((Si(CH$_3$)$_3$)C$_5$H$_4$)$_2$NbH$_3$, at bis(trimethylsilylcyclopentadienyl) trihydroniobium | 40 sccm |
|---|---|
| Ammonia, NH$_3$, at | 40 sccm |
| Helium, He, at | 50 sccm. |

A subsequent plasma treatment at a chamber pressure of 150 milliTorr with 750 W of high frequency power (13 MHz) is applied to the showerhead for contaminant removal from the deposited tantalum nitride layer, the plasma gases flow into the reactor as follows:

| ((Si(CH$_3$)$_3$)C$_5$H$_4$)$_2$NbH$_3$, at bis(trimethylsilylcyclopentadienyl) trihydroniobium | 40 sccm |
|---|---|
| Ammonia, NH$_3$, at | 40 sccm |
| Helium, He, at | 90 sccm. |

While the foregoing is directed to the preferred embodiment of the present invention, other and further embodiments of the invention may be devised without departing from the basic scope thereof, and the scope thereof is determined by the claims that follow.

What is claimed is:

1. A method for processing a substrate, comprising:
   a. depositing a metal film on the substrate by the decomposition of a first organometallic precursor in the presence of a processing gas; then
   b. depositing a metal nitride film on the metal film by the decomposition of a second organometallic precursor in the presence of a nitrating reactant gas, wherein the first and second organometallic precursors have the formula:

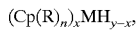

wherein:
   Cp is a cyclopentadienyl functional group,
   M is a metal selected from the group consisting of tantalum, vanadium, niobium,
   R is an organic group,
   n is an integer from 0 to 5,
   x is an integer from 1 to 4, and
   y is the valence of, M.

2. The method of claim 1, wherein the organic group has at least one carbon-silicon bond.

3. The method of claim 2, wherein the organic group comprises an alkyl silyl group having between 0 and 3 hydrocarbyl substituents selected from the group consisting of silyl, methylsilyl, dimethylsilyl, trimethylsilyl, and combinations thereof.

4. The method of claim 1, wherein the first and second organometallic precursors are the same organometallic precursor.

5. The method of claim 1, wherein the metal nitride film is deposited at a pressure of less than about 20 Torr.

6. The method of claim 1, wherein the metal film and the metal nitride film are deposited sequentially in the same chamber.

7. The method of claim 1, wherein the metal film and the metal nitride film are deposited at a pressure of less than about 20 Torr.

8. The method of claim 1, wherein the metal film is composed of a material selected from the group consisting of vanadium, tantalum, niobium, hafnium, vanadium silicide, tantalum silicide, niobium silicide, hafnium silicide, and combinations thereof.

9. The method of claim 1, wherein the metal nitride film is composed of a material selected from the group consisting of tantalum nitride, tantalum carbon nitride, tantalum silicon nitride, vanadium nitride, vanadium carbon nitride, vanadium silicon nitride, niobium nitride, niobium carbon nitride, niobium silicon nitride, hafnium nitride, hafnium carbon nitride, hafnium silicon nitride, and combinations thereof.

10. The method of claim 1, further comprising exposing the metal film to a first plasma and exposing the metal nitride film to a second plasma.

11. A method for processing a substrate, comprising:
a. introducing a organometallic precursor into a processing chamber maintained at a pressure of less than about 20 Torr, the organometallic precursor having the formula:

$(Cp(R)_n)_x MH_{y-x}$, wherein:
Cp is a cyclopentadienyl functional group,
M is a metal selected from the group consisting of tantalum, vanadium, niobium, and hafnium,
R is an organic compound,
n is an integer from 0 to 5, and
x is an integer from 1 to 4, and
y is the valence of M;
b. exposing the organometallic precursor to a processing gas; and
c. decomposing the organometallic precursor to deposit a film.

12. The method of claim 11, wherein the deposited film is a material selected from the group consisting of tantalum, tantalum nitride, tantalum carbide, tantalum silicon nitride, vanadium, vanadium nitride, vanadium carbide, vanadium silicon nitride, niobium, niobium nitride, niobium carbide, niobium silicon nitride, hafnium, hafnium nitride, hafnium carbide, hafnium silicon nitride, and combinations thereof.

13. The method of claim 11, wherein the organic group has at least one carbon-silicon bond.

14. The method of claim 11, wherein the organic group comprises an alkyl silyl group is a hydrocarbon having at least one carbon-silicon bond and between 0 and 3 hydrocarbyl substituents selected from the group consisting of silyl, methylsilyl, dimethylsilyl, trimethylsilyl, and combinations thereof.

15. The method of claim 11, wherein the organometallic precursor decomposes by heating the substrate to a temperature above the decomposition temperature of the organometallic precursor.

16. The method of claim 15, wherein the temperature of the substrate is between about 100° C. and about 450° C.

17. The method of claim 11, wherein the organometallic precursor decomposes by generating a plasma at a power of between about 200 watts and about 1000 Watts.

18. The method of claim 11, further comprising:
d. exposing the film to a plasma.

19. The method of claim 18, wherein the film comprises tantalum, the processing gas is selected from the group consisting of argon, hydrogen, and combinations thereof, and the plasma comprises a gas selected from the group consisting of argon, hydrogen, and combinations thereof.

20. The method of claim 18 wherein the film comprises tantalum, the processing gas comprises argon, and the plasma comprises argon.

21. A method for forming a feature on a substrate comprising:
depositing a dielectric layer on the substrate;
etching an aperture within the dielectric layer;
depositing ac metal layer conformally on the dielectric layer by decomposing a first organometallic precursor in the presence of a processing gas;
depositing a metal nitride layer conformally on the metal layer by decomposing a second organometallic precursor in the presence of a nitrating reactant gas at a pressure of less than about 20 Torr,
wherein the first and second organometallic precursors have the formula:

$(Cp(R)_n)_x MH_{y-x}$, wherein:
Cp is a cyclopentadienyl functional group,
M is a metal selected from the group consisting of tantalum, vanadium, niobium, and hafnium,
R is an organic group,
n is an integer from 0 to 5,
x is an integer from 1 to 4, and
y is the valence of M; and
depositing a conductive metal layer on the metal nitride layer.

22. The method of claim 21, wherein the organic group has at least one carbon-silicon bond.

23. The method of claim 21, wherein the organic group comprises an alkyl silyl group having between 0 and 3 hydrocarbyl substituents selected from the group consisting of silyl, methylsilyl, dimethylsilyl, trimethylsilyl, and combinations thereof.

24. The method of claim 21, wherein the first and second organometallic precursors are the same organometallic precursor.

25. The method of claim 21, wherein the metal film and the metal nitride film are deposited sequentially in the same chamber.

26. The method of claim 21, wherein the metal film is composed of a material selected from the group consisting of vanadium, tantalum, niobium, hafnium, vanadium, tantalum, niobium, hafnium, vanadium silicide, tantalum silicide, niobium silicide, hafnium silicide, and combinations thereof, and combinations thereof.

27. The method of claim 21, wherein the metal nitride film is composed of a material selected from the group consisting of tantalum nitride, tantalum carbon nitride, tantalum silicon nitride, vanadium nitride, vanadium carbon nitride, vanadium silicon nitride, niobium nitride, niobium carbon nitride, niobium silicon, nitride, hafnium nitride, hafnium carbon nitride, hafnium silicon nitride, and combinations thereof.

28. The method of claim 21, further comprising exposing the metal film to a first plasma, the first plasma comprises gases selected from the group consisting of argon, hydrogen, and combinations thereof.

29. The method of claim 21, further comprising exposing the metal nitride film to a second plasma, the second plasma comprises gases selected from the group consisting of argon, hydrogen, nitrogen, ammonia, and combinations thereof.

30. The method of claim 21, wherein the conducting metal layer is copper.

31. The method of claim 21, wherein the conducting metal layer is deposited by electroplating.

* * * * *

UNITED STATES PATENT AND TRADEMARK OFFICE
CERTIFICATE OF CORRECTION

PATENT NO. : 6,743,473 B1
DATED : June 1, 2004
INVENTOR(S) : Vijay D. Parkhe, Gilbert Hausmann and Jagadish Kalyanam It is certified that error appears in the above-identified patent and that said Letters Patent is hereby corrected as shown below:

Column 3,
Line 18 should read, -- $(Cp(R)_n)_x MH_{y-x}$ (I) --.

Column 4,
Line 37, change "many" to -- may --.
Line 62, change "metalation" to -- metallization --.

Column 5,
Line 20, change "stirring" to -- striking --.
Line 55, change "trirethylsilyl" to -- trimethylsilyl --.

Column 6,
Line 11, change the first occurrence of "100" to "1000".
Line 32, remove the "," after "vapor".
Line 46, remove the "," after "film".

Column 7,
Lines 3, 55 and 58, change "density" to -- densify --.
Line 12, delete the "," after "plasma".

Column 8
Line 7, insert -- be -- after "may then".
Line 17, delete the "," after "plasma".
Line 67, change "conformably" to -- conformally --.

Column 9,
Line 45, delete the "," after "between".
Line 58, delete the "," after "molar".

Column 10,
Line 9, change "NON-conducting" to -- Non-conducting --.
Line 18, change "process in" to -- processing --.

Column 11,
Line 53, change "density" to -- densify --.

Column 12,
Line 2, delete the "," after "about".
Line 17, change "20" to -- 120 --.

UNITED STATES PATENT AND TRADEMARK OFFICE
CERTIFICATE OF CORRECTION

PATENT NO. : 6,743,473 B1
DATED : June 1, 2004
INVENTOR(S) : Vijay D. Parkhe, Gilbert Hausmann and Jagadish Kalyanam It is certified that error appears in the above-identified patent and that said Letters Patent is hereby corrected as shown below:

Column 13,
Line 24, change "drubbing" to -- rubbing --.

Column 14,
Line 36, delete the "." after the first occurrence of "temperature".

Column 15,
Line 41, delete the "," after the second occurrence of "CVD".
Line 43, delete the "." after "CVD".
Line 58, change "though" to -- through --.
Line 59, change "which" to -- while the --.

Column 16,
Line 6, change "density" to -- densify --.

Column 18,
Line 5, change "bold" to -- hold --.

Column 19,
Line 25, change "preformed" to -- performed --.

Column 20,
Line 34, change "$(C_5H_5)_2TaA_3$" to -- $(C_5H_5)_2TaH_3$ --.

Column 22,
Line 58, insert -- and hafnium, -- after "vanadium, niobium,"

Column 24,
Line 27, change "ac" to -- a --.
Lines 66-67, delete the second occurrence of "vanadium, tantalum, niobium, hafnium".

UNITED STATES PATENT AND TRADEMARK OFFICE
CERTIFICATE OF CORRECTION

PATENT NO. : 6,743,473 B1
DATED : June 1, 2004
INVENTOR(S) : Vijay D. Parkhe, Gilbert Hausmann and Jagadish Kalyanam It is certified that error appears in the above-identified patent and that said Letters Patent is hereby corrected as shown below:

Column 25,
Line 2, delete the second occurrence of "and combinations thereof".
Line 8, delete the "," after "niobium silicon".

Signed and Sealed this

Twenty-second Day of March, 2005

JON W. DUDAS
*Director of the United States Patent and Trademark Office*